(12) United States Patent
Lim et al.

(10) Patent No.: US 12,323,115 B2
(45) Date of Patent: Jun. 3, 2025

(54) OPERATIONAL TRANSCONDUCTANCE AMPLIFIER CIRCUIT INCLUDING ACTIVE INDUCTOR

(71) Applicant: Samsung Electronics Co., Ltd., Suwon-si (KR)

(72) Inventors: Baekjin Lim, Seoul (KR); Youngchul Cho, Seongnam-si (KR); Seungjin Park, Hwaseong-si (KR); Youngdon Choi, Seoul (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 711 days.

(21) Appl. No.: 17/536,064

(22) Filed: Nov. 28, 2021

(65) Prior Publication Data

US 2022/0209729 A1 Jun. 30, 2022

(30) Foreign Application Priority Data

Dec. 29, 2020 (KR) .................. 10-2020-0186784
Jun. 2, 2021 (KR) .................. 10-2021-0071710

(51) Int. Cl.
*H03F 3/45* (2006.01)
(52) U.S. Cl.
CPC ..... *H03F 3/45183* (2013.01); *H03F 3/45273* (2013.01); *H03F 3/45475* (2013.01); *H03F 2200/153* (2013.01)
(58) Field of Classification Search
CPC ............ H03F 3/45183; H03F 3/45273; H03F 3/45475; H03F 2200/153; H03F 2200/36;
(Continued)

(56) References Cited

U.S. PATENT DOCUMENTS 5,142,242 A 8/1992 Schaffer
6,741,130 B2 5/2004 Wey et al.
(Continued)

FOREIGN PATENT DOCUMENTS

EP 3408938 B1 7/2019
KR 1020010064258 A 7/2001
(Continued)

OTHER PUBLICATIONS

Lee Seung-Hun et al., "Current-Mode Transceiver for Silicon Interposer Channel", IEEE Journal of Solid-State Circuits, Sep. 2014, pp. 2044-2053, vol. 49, No. 9.

*Primary Examiner* — Andrea Lindgren Baltzell
*Assistant Examiner* — Khiem D Nguyen
(74) *Attorney, Agent, or Firm* — Muir Patent Law, PLLC

(57) ABSTRACT

An amplifier circuit comprises a first unit circuit and a second unit circuit. The first unit circuit may include a first current mirror circuit that includes a first active inductor including a P-channel transistor, and a first input circuit configured to generate a first differential current and a second differential current based on a pair of differential input signals. The second unit circuit may include a second current mirror circuit that includes a second active inductor including a P-channel transistor, and a second input circuit configured to generate a third differential current and a fourth differential current based on the pair of differential input signals.

18 Claims, 14 Drawing Sheets

(58) Field of Classification Search
CPC ............. H03F 2200/84; H03F 2200/87; H03F 2203/45134; H03F 2203/45176; H03F 2203/45644; H03F 1/42; H03F 3/4521; H03F 3/45197; G11C 7/22
USPC .......................................................... 330/253
See application file for complete search history.

(56) References Cited

U.S. PATENT DOCUMENTS

| | | | |
|---|---|---|---|
| 7,576,610 B2 * | 8/2009 | Dalena | ................ H03F 3/45183 |
| | | | 330/261 |
| 8,487,702 B2 | 7/2013 | Lin | |
| 8,723,625 B2 | 5/2014 | Lee | |
| 10,056,892 B2 | 8/2018 | Nicollini et al. | |
| 2010/0026349 A1 | 2/2010 | Jiang | |
| 2010/0123506 A1 | 5/2010 | Vu et al. | |

FOREIGN PATENT DOCUMENTS

| | | |
|---|---|---|
| KR | 101100655 B1 | 1/2012 |
| KR | 1020170012803 A | 2/2017 |
| KR | 102088668 B1 | 3/2020 |
| WO | 2018063568 A1 | 4/2018 |

* cited by examiner

OPERATIONAL TRANSCONDUCTANCE AMPLIFIER CIRCUIT INCLUDING ACTIVE INDUCTOR

CROSS-REFERENCE TO RELATED APPLICATIONS

This application is based on and claims priority under 35 U.S.C. § 119 to Korean Patent Application No. 10-2020-0186784, filed on Dec. 29, 2020, and Korean Patent Application No. 10-2021-0071710, filed on Jun. 2, 2021, in the Korean Intellectual Property Office, the disclosures of which are incorporated by reference herein in their entirety.

BACKGROUND

The inventive concept relates to amplifier circuits, and more particularly, to operational transconductance amplifier circuits including active inductors.

Double data rate (DDR) 5 has a high data rate for data transmission and reception, and thus, lengths of electrical paths that determine outputs of operational transconductance amplifiers are different from each other, resulting in distortion of a duty cycle. Inductors may be included in the amplifiers to reduce the distortion, but in general, as a frequency decreases, inductors with high inductances are required to maintain all impedances at a constant level, and when inductances of the inductors increase, the inductors occupy a large area, thereby hindering miniaturization of integrated circuits. Accordingly, there is a need for effectively using active inductors including resistors and capacitors.

SUMMARY

The inventive concept provides operational transconductance amplifier circuits with an increased bandwidth and improved duty cycle characteristics.

According to one embodiment, an operational transconductance amplifier may include an input circuit configured to generate a first differential current and a second differential current based on a pair of differential input signals, a first current mirror circuit configured to generate a first mirror current based on the first differential current and output the first mirror current via a first output terminal, and a second current mirror circuit configured to generate a second mirror current based on the second differential current and output the second mirror current via a first nodes of a third current mirror circuit. The second current mirror circuit and the third current mirror circuit are connected to each other through the first node. The third current mirror circuit is configured to generate a third mirror current based on the second mirror current and output the third mirror current via the first output terminal. The first current mirror circuit and the second current mirror circuit may respectively include a first active inductor and a second active inductor each including a P-channel transistor. The third current mirror circuit may include a third active inductor including an N-channel transistor.

According to another embodiment, an amplifier circuit may include a first unit circuit and a second unit circuit. The first unit circuit may include a first current mirror circuit that includes a first active inductor including a P-channel transistor, and a first input circuit configured to generate a first differential current and a second differential current based on a pair of differential input signals. The second unit circuit may include a second current mirror circuit that includes a second active inductor including a P-channel transistor, and a second input circuit configured to generate a third differential current and a fourth differential current based on the pair of differential input signals.

According to another embodiment, a memory device may include a memory cell array including multiple memory blocks that each include a plurality of memory cells connected to word lines and bit lines arranged in rows and columns, and configured to perform a write operation and a read operation for the plurality of memory cells by using an internal power supply voltage, and a clock buffer configured to receive a pair of differential input signals having a clock signal and an inverted clock signal and correct a duty cycle of the clock signal; wherein the clock buffer may include an input circuit configured to generate a first differential current and a second differential current based on the clock signal and the inverted clock signal, a first current mirror circuit including a first active inductor including a P-channel transistor and configured to generate a first mirror current and a second mirror current based on the first differential current, a second current mirror circuit including a second active inductor including the P-channel transistor and configured to generate a third mirror current and a fourth mirror current based on the second differential current, a third current mirror circuit including a third active inductor including an N-channel transistor and configured to generate a fifth mirror current based on the third mirror current, and a fourth current mirror circuit including a fourth active inductor including the N-channel transistor and configured to generate a sixth mirror current based on the second mirror current.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, example embodiments of the inventive concept will be described in detail with reference to the accompanying drawings.

Figure 1A:
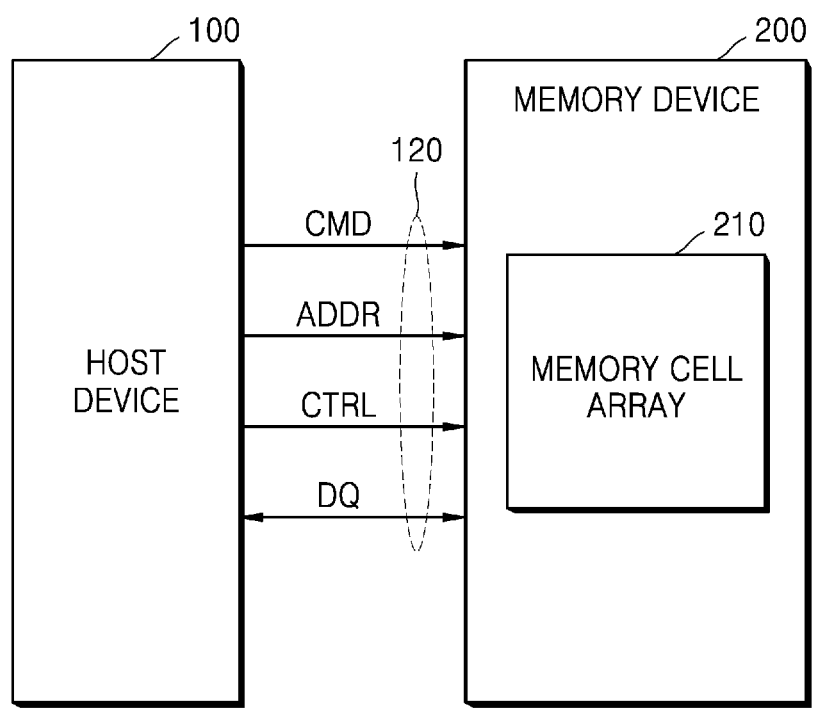
FIG. 1A illustrates a system including a memory device according to an example embodiment of the inventive concept.

FIG. 1A illustrates a system including a memory device according to an example embodiment of the inventive concept.

Referring to FIG. 1A, a system 10 may include a host device 100 and a memory device 200. The host device 100 may be connected to and communicate with the memory device 200 through a memory bus 120. The memory device 200 may include a memory cell array 210.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The host device 100 may be, for example, a computing system such as a computer, a notebook computer, a server, a workstation, a portable communication terminal, a personal digital assistant (PDA), a portable multimedia player (PMP), a smartphone, or a wearable device. Alternatively, the host device 100 may be one of components included in a computing system such as a graphics card. The host device 100 may serve as a functional block for performing a general computer operation of the system 10 and may correspond to a central processing unit (CPU), a digital signal processor (DSP), a graphics processing unit. (GPU) or an application processor (AP).

The memory bus 120 may include signal lines for transmitting a clock signal CLK, a data strobe signal DQS, a command signal CMD, an address (or an address signal) ADDR, and a control signal CTRL, and data lines (or data bus) for transmitting input/output (I/O) data DQ. For the sake of brevity, the signal lines and the data lines between the host device 100 and the memory device 200 are each illustrated as one signal line, but in reality, the host device 100 may be connected to and the memory device 200 through a plurality of signal lines.

The I/O data DQ may be written to the memory device 200 or data may read from the memory device 200 under the control of the host device 100. For example, the memory device 200 may include a dynamic random-access memory (DRAM) device.

Although the above-described embodiment illustrates that the memory device 200 corresponds to DRAM, the memory device 200 of the inventive concept is not limited thereto. According to various embodiments, the memory device 200 may correspond to at least one of volatile memory devices such as synchronous DRAM (SDRAM), double data rate SDRAM (DDR SDRAM), low power DDR SDRAM (LPDDR SDRAM), graphics DDR SDRAM (GDDR SDRAM), wide I/O DRAM, high bandwidth memory (HBM), and hybrid memory cube (HMC). According to an embodiment, the memory device 200 may correspond to any one of non-volatile memory devices such as flash memory, phase-change RAM (PRAM), magnetic RAM (MRAM), resistive RAM (RRAM), and ferroelectric RAM (FRAM).

Figure 1B:
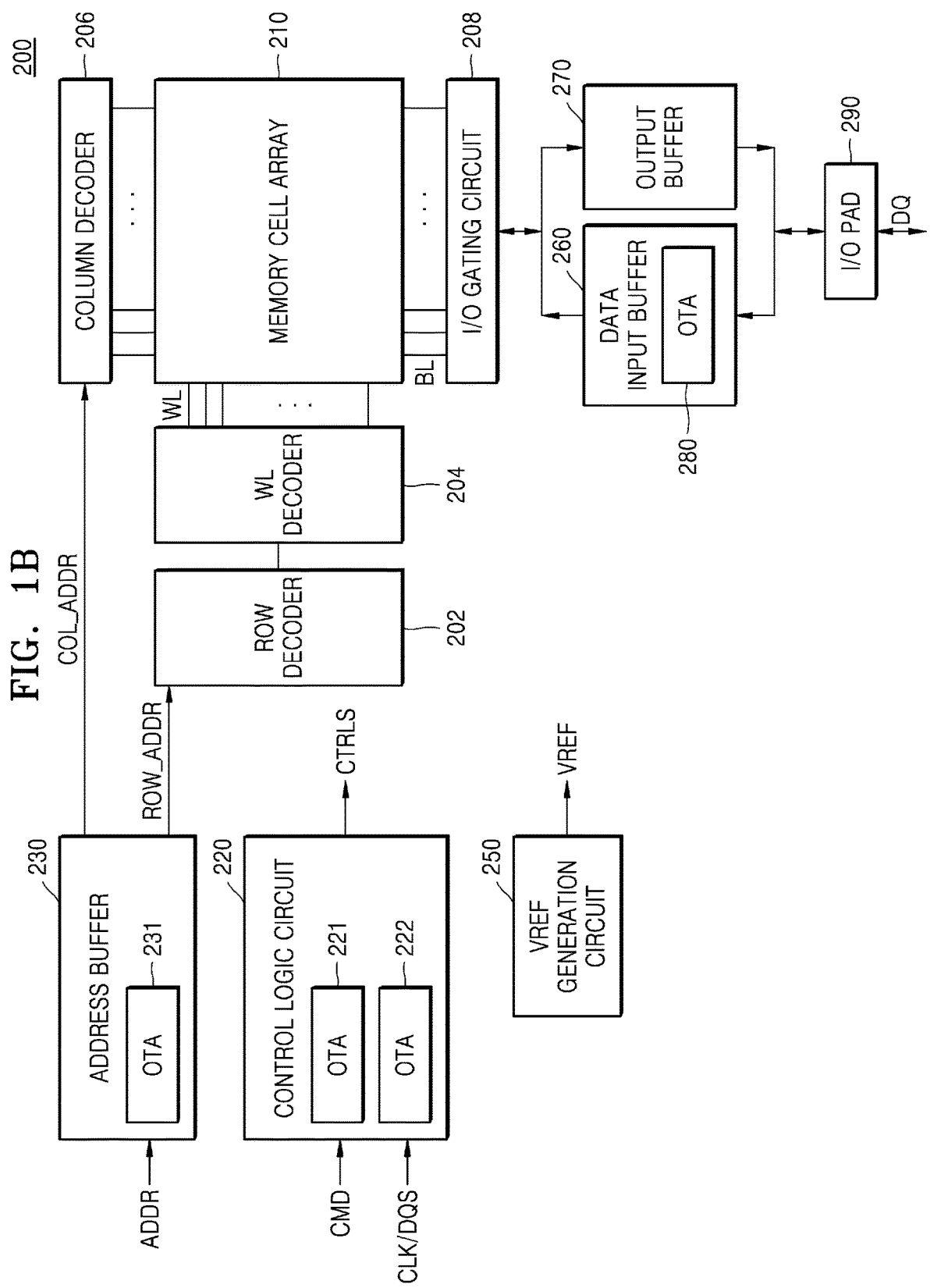
FIG. 1B illustrates a memory device according to an example embodiment of the inventive concept.

FIG. 1B illustrates a memory device according to an example embodiment of the inventive concept.

Referring to FIG. 1B, the memory device 200 may include the memory cell array 210, a row decoder 202, a word line decoder 204, a column decoder 206, an I/O gating circuit 208, a control logic circuit 220, an address buffer 230, a reference voltage generation circuit 250, a data input buffer 260, a data output buffer 270, and an I/O pad 290.

The memory cell array 210 includes a plurality of memory cells arranged in rows and columns in a matrix. The memory cell array 210 includes a plurality of word lines WL and a plurality of bit lines BL connected to the plurality of memory cells. The plurality of word lines WL may be connected to the plurality of memory cells in rows, and the plurality of bit lines BL may be connected to the plurality of memory cells in columns.

The row decoder 202 may select any one of the plurality of word lines WL connected to the memory cell array 210. The row decoder 202 may decode a row address ROW_ADDR received from the address buffer 230 to select one word line WL corresponding to the row address ROW_ADDR and connect the selected word line WL to the word line decoder 204 to be activated. The column decoder 206 may select a certain bit lines BL from among the plurality of bit lines BL of the memory cell array 210. The column decoder 206 may decode a column address COL_ADDR received from the address buffer 230 to generate a column selection signal CSL and connect the bit lines BL selected by the column selection signal CSL to the I/O gating circuit 208.

According to an embodiment, the address buffer 230 may include a first operational transconductance amplifier 231. The first operational transconductance amplifier 231 may receive the address signal ADDR input to the address buffer 230. The first operational transconductance amplifier 231 may receive the address signal ADDR as a first input and receive a reference voltage having a certain level as a second input. For example, the first operational transconductance amplifier 231 may compare the reference voltage level with a voltage level of the address signal ADDR. When the reference voltage level is higher than the voltage level of the address signal ADDR, the first operational transconductance amplifier 231 may drive an output line to "logic high". When the reference voltage level is lower than the voltage level of the address signal ADDR, the first operational transconductance amplifier 231 may drive the output line to "logic low". The first operational transconductance amplifier 231 may correct mismatch of a duty cycle between the address signal ADDR and the reference voltage level, thereby preventing an output line from being driven to "logic low" even though the output line has to be driven to "logic high" or being driven to "logic high" even though the output line has to be driven to "logic low". Although description is made that the first operational transconductance amplifier 231 is included in the address buffer 230 in the above-described embodiment, the inventive concept is not limited thereto. According to various embodiments, the first operational transconductance amplifier 231 may be arranged in a previous stage of the address buffer 230 to correct a duty cycle error of the address signal ADDR and may transmit the corrected address signal ADDR to the address buffer 230.

The control logic circuit 220 may receive the clock signal CLK and the command signal CMD and generate control signals CTRLS for controlling an operation timing and/or a memory operation of the memory device 200. The control logic circuit 220 may read data from and write data to the memory cell array 210 by using the control signals CTRLs. According to one embodiment, the control logic circuit 220 may include a second operational transconductance amplifier 221 that receives the command signal CMD as an input, and a third operational transconductance amplifier 222 that receives the clock signal CLK or a write clock signal WCLK as an input.

The second operational transconductance amplifier 221 may receive the command signal CMD transmitted to the control logic circuit 220. The second operational transconductance amplifier 221 may receive a differential input signal. For example, the second operational transconductance amplifier 221 may receive the command signal CMD as a first input and receive a reference voltage having a certain level as a second input. The second operational transconductance amplifier 221 may correct mismatch of a duty cycle between the command signal CMD and the reference voltage level to prevent an operation error due to timing mismatch of the command signal CMD. For example, the second operational transconductance amplifier 221 may compare the reference voltage level with a voltage level of the command signal CMD. When the reference voltage level is higher than the voltage level of the command signal CMD, the first operational transconductance amplifier 231 may drive the output line to "logic high". When the reference voltage level is lower than the voltage level of the command signal CMD, the second operational transconductance amplifier 221 may drive the output line to "logic low". The second operational transconductance amplifier 221 may correct mismatch of a duty cycle between the command signal CMD and the reference voltage level, thereby preventing the output line from being driven to "logic low" even though the output line has to be driven to "logic high" or being driven to "logic high" even though the output line has to be driven to "logic low". Although description is made that the second operational transconductance amplifier 221 is included in the control logic circuit 220 in the above-described embodiment, the inventive concept is not limited thereto. According to various embodiments, the second operational transconductance amplifier 221 may be arranged in a previous stage of the control logic circuit 220 to correct a duty cycle error of the command signal CMD and may transmit, to the control logic circuit 220, the command signal CMD of which the duty cycle error is corrected.

The third operational transconductance amplifier 222 may receive the clock signal CLK or the data strobe signal DQS transmitted to the control logic circuit 220. The third operational transconductance amplifier 222 may receive a differential input signal. For example, the third operational transconductance amplifier 222 may receive the clock signal CLK as a first input and an inverted clock signal CLKB as a second input. In this case, the third operational transconductance amplifier 222 may be used as a clock buffer. Alternatively, the third operational transconductance amplifier 222 may receive the data strobe signal DQS as a first input and an inverted data strobe signal DQSB as a second input. In this case, the third operational transconductance amplifier 222 may be used as a DQS buffer. The third operational transconductance amplifier 222 may correct a duty cycle mismatch of the clock signal CLK or the data strobe signal DQS.

The I/O gating circuit 208 may include read data latches for storing read data of the bit lines BL selected by a column selection signal CSL, and a write driver for writing write data to the memory cell array 210. The read data stored in the read data latches of the I/O gating circuit 208 may be provided to a data bus (or a data line) through the output buffer 270 and the I/O pad 290. Write data may be applied to the memory cell array 210 through the I/O pad 290 connected to the data bus, the data input buffer 260, and a write driver of the I/O gating circuit 208.

According to various embodiments, a fourth operational transconductance amplifier 280 may be arranged on signal lines that transmit the data DQ. For example, the operational transconductance amplifier 280 may be included in the data input buffer 260. The operational transconductance amplifier 280 may receive a differential input signal transmitted to the data input buffer 260. For example, the operational transconductance amplifier 280 may receive the data DQ as a first input and receive an inverted data DQB as a second input.

The reference voltage generation circuit 250 may provide a reference voltage VREF used for circuits of the memory device 200. For example, the reference voltage VREF may be used by the control logic circuit 220 to be compared with a voltage of a signal received from a command bus to determine a logic value of the received signal.

Figure 2:
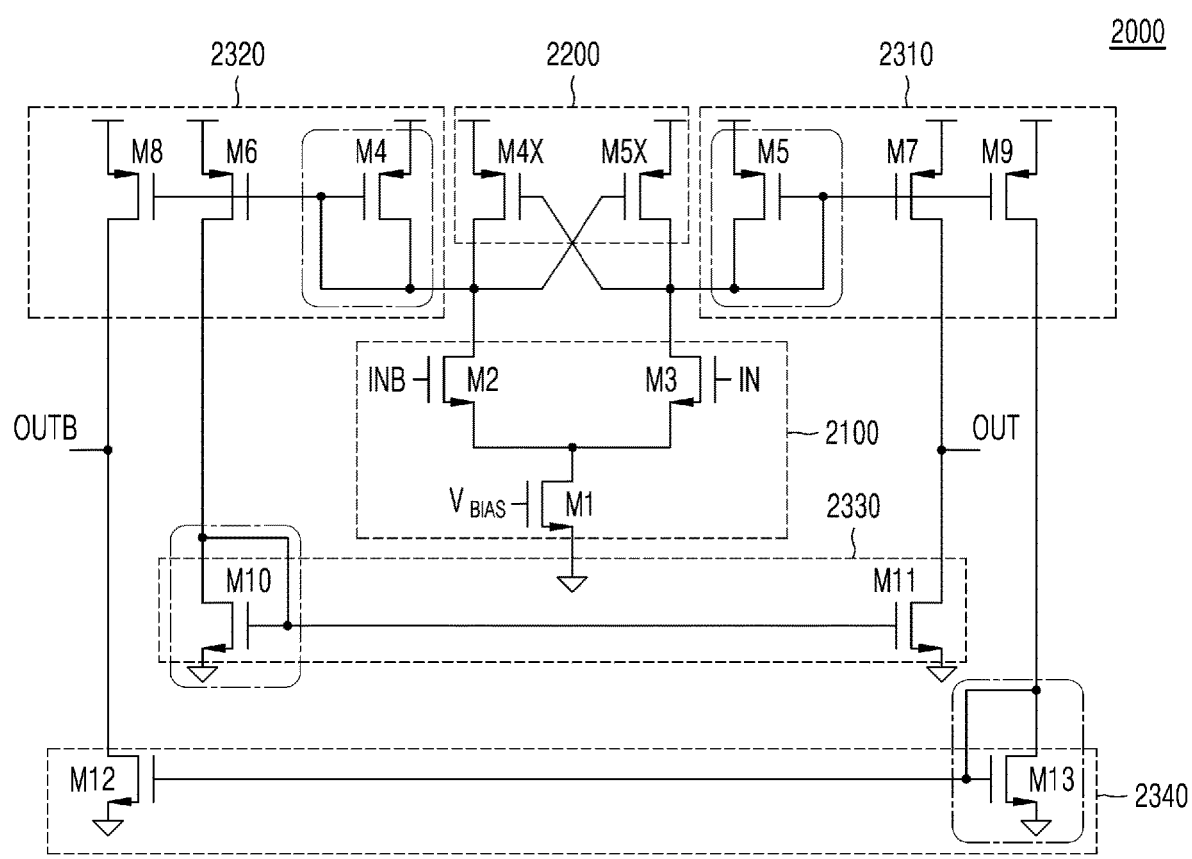
FIG. 2 illustrates an operational transconductance amplifier according to a comparative example.

FIG. 2 illustrates an operational transconductance amplifier 2000 according to a comparative example.

Referring to FIG. 2, the operational transconductance amplifier circuit 2000 may include a plurality of current mirror circuits, a differential input circuit 2100, and a feedback circuit 2200. The plurality of current mirror circuits may include a first current mirror circuit 2310, a second current mirror circuit 2320, a third current mirror circuit 2330, and a fourth current mirror circuit 2340.

The differential input circuit 2100 may include a first transistor M1, a second transistor M2, and a third transistor M3. Alternatively, the differential input circuit 2100 may include a first stage and a second stage. For example, the first stage may include the first transistor M1 and the second transistor M2 connected in series, and the second stage may include the first transistor M1 and the third transistor M3 connected in series. A gate terminal of the first transistor M1 may receive a bias voltage $V_{BIAS}$. The first transistor M1 may generate a bias current $I_{BIAS}$ based on the bias voltage $V_{BIAS}$. A differential input pair may be respectively input to a gate terminal of the second transistor M2 and a gate terminal of the third transistor M3. The differential input pair may correspond to a signal pair of a clock signal CLK and an inverted clock signal CLKB, a signal pair of a data strobe signal DQS and an inverted data strobe signal DQSB, a signal pair of an address ADDR and an inverted address ADDRB, or a signal pair of a data DQ and an inverted data DQB. The sum of a current flowing through the second transistor M2 and a current flowing through the third transistor M3 may correspond to the bias current $I_{BIAS}$.

The first current mirror circuit 2310 may include a fifth transistor M5, a seventh transistor M7, and a ninth transistor M9. The fifth transistor M5, the seventh transistor M7, and the ninth transistor M9 may each correspond to a P-channel transistor. A gate terminal of the fifth transistor M5 may be connected to a gate terminal of the seventh transistor M7 and a gate terminal of the ninth transistor M9. That is, the fifth transistor M5, the seventh transistor M7, and the ninth transistor M9 may form a common gate. The first current mirror circuit 2310 may generate a mirror current based on a first reference current $I_{REF1}$. The fifth transistor M5 may generate a first bias voltage $V_{BIAS1}$ based on the first reference current $I_{REF1}$. The first bias voltage $V_{BIAS1}$ may correspond to a voltage of the common gate of the first current mirror circuit 2310. The seventh transistor M7 and the ninth transistor M9 may respectively generate a first mirror current $I_{M1}$ and a second mirror current $I_{M2}$ based on the first bias voltage $V_{BIAS1}$. When the seventh transistor M7 and the ninth transistor M9 have the same characteristics, a magnitude of the first mirror current $I_{M1}$ may be the same as a magnitude of the second mirror current $I_{M2}$. When a ratio between a width and a length of the seventh transistor M7 are different from a ratio between a width and a length of the ninth transistor M9, the first mirror current $I_{M1}$ may be generated to be proportional to the ratio between a width and a length of the seventh transistor M7 and the second mirror current $I_{M2}$ may be generated to be proportional to the ratio between a width and a length of the ninth transistor M9.

The second mirror circuit 2320 may include a fourth transistor M4, a sixth transistor M6, and an eighth transistor M8. The fourth transistor M4, the sixth transistor M6, and the eighth transistor M8 may each correspond to a P-channel transistor. A gate terminal of the fourth transistor M4 may be connected to a gate terminal of the sixth transistor M6 and a gate terminal of the eighth transistor M8. That is, the fourth transistor M4, the sixth transistor M6, and the eighth transistor M8 may form a common gate. The second current mirror circuit 2320 may generate a mirror current based on a second reference current $I_{REF2}$. The fourth transistor M4 may generate a second bias voltage $V_{BIAS2}$ based on the second reference current $I_{REF2}$. The second bias voltage $V_{BIAS2}$ may correspond to a voltage of the common gate of the second current mirror circuit 2320. The sixth transistor M6 and the eighth transistor M8 may respectively generate a third mirror current $I_{M3}$ and a fourth mirror current $I_{M4}$ based on the second bias voltage $V_{BIAS2}$.

The third current mirror circuit 2330 may include a tenth transistor M10 and an eleventh transistor M11. The tenth transistor M10 and the eleventh transistor M11 may each correspond to an N-channel transistor. A gate terminal of the tenth transistor M10 may be connected to a gate terminal of the eleventh transistor M11. That is, the tenth transistor M10 and the eleventh transistor M11 may form a common gate. The third current mirror circuit 2330 may generate a mirror current based on a third reference current $I_{REF3}$. The third reference current $I_{REF3}$ may be the same as the third mirror current $I_{M3}$ generated through the sixth transistor M6. The tenth transistor M10 may generate a third bias voltage $V_{BIAS3}$ based on the third reference current $I_{REF3}$. The third bias voltage $V_{BIAS3}$ may correspond to a voltage of the common gate of the third current mirror circuit 2330. The eleventh transistor M11 may generate a fifth mirror current $I_{M5}$ based on the third bias voltage $V_{BIAS3}$.

The fourth current mirror circuit 2340 may include a twelfth transistor M12 and a thirteenth transistor M13. The twelfth transistor M12 and the thirteenth transistor M13 may each correspond to an N-channel transistor. A gate terminal of the twelfth transistor M12 may be connected to a gate terminal of the thirteenth transistor M13. That is, the twelfth transistor M12 and the thirteenth transistor M13 may form a common gate. The fourth current mirror circuit 2340 may generate a mirror current based on a fourth reference current $I_{REF4}$. The fourth reference current $I_{REF4}$ may be the same as the second mirror current $I_{M2}$ generated through the ninth transistor M9. The thirteenth transistor M13 may generate a fourth bias voltage $V_{BIAS4}$ based on the fourth reference current $I_{REF4}$ (or the second mirror current $I_{M2}$). The fourth bias voltage $V_{BIAS4}$ may correspond to the voltage of the common gate of the fourth current mirror circuit 2340. The twelfth transistor M12 may generate a sixth mirror current $I_{M6}$ based on the fourth bias voltage $V_{BIAS4}$.

The feedback circuit 2200 may include a fourth feedback transistor M4X and a fifth feedback transistor M5X. The fourth feedback transistor M4X and the fifth feedback transistor M5X may each correspond to a P-channel transistor. The fifth transistor M5 of the first current mirror circuit 2310 may be connected to the second current mirror circuit 2320 through the fourth feedback transistor M4X. The fourth transistor M4 of the second current mirror circuit 2320 may be connected to the first current mirror circuit 2310 through the fifth feedback transistor M5X.

A drain terminal of the ninth transistor M9 may correspond to a drain terminal of the thirteenth transistor M13. That is, the ninth transistor M9 may form a common drain with the thirteenth transistor M13. The second mirror current $I_{M2}$ generated by the ninth transistor M9 may operate as the fourth reference current $I_{REF4}$ input to the thirteenth transistor M13 through the common drain.

A drain terminal of the sixth transistor M6 may correspond to a drain terminal of the tenth transistor M10. That is, the sixth transistor M6 may form a common drain with the tenth transistor M10. The third mirror current $I_{M3}$ generated by the sixth transistor M6 may operate as the third reference current $I_{REF3}$ input to the tenth transistor M10 through the common drain.

An output terminal OUT may output a signal based on a difference value between the first mirror current $I_{M1}$ generated through the seventh transistor M7 and the fifth mirror current $I_{M5}$ of the eleventh transistor M11. Hereinafter, for convenience of description, the terms of the output terminal OUT and an output signal OUT may be used interchangeably.

An inverted output terminal OUTB outputs a signal based on a difference value between the fourth mirror current $I_{M4}$ generated through the eighth transistor M8 and the sixth mirror current $I_{M6}$ generated through the twelfth transistor M12. Hereinafter, for convenience of description, the terms of the inverted output terminal OUTB and an inverted output signal OUTB may be used interchangeably.

Figure 3A:
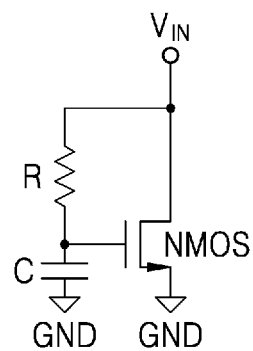
FIG. 3A illustrates an NMOS active inductor according to example embodiments.
Figure 3B:
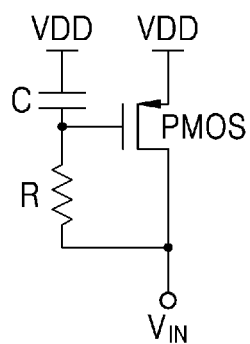
FIG. 3B illustrates a PMOS active inductor according to example embodiments.

FIG. 3A illustrates an NMOS active inductor according to example embodiments, and FIG. 3B illustrates a PMOS active inductor according to example embodiments.

Referring to FIG. 3A, the NMOS active inductor of FIG. 3A may include an N-channel transistor NMOS, a resistor R, and a capacitor C. Herein, the capacitor C may include a parasitic capacitance or an employed capacitance. The N-channel transistor NMOS may be connected to the resistor R and the capacitor C. For example, a gate terminal of the N-channel transistor NMOS may be connected to the capacitor C and the resistor R. The capacitor C may be connected between a ground GND and the gate terminal of the N-channel transistor NMOS. Hereinafter, for convenience of description, the terms of the ground GND, a ground node GND, and a ground line GND may be used interchangeably. The resistor R may connect the gate terminal of the N-channel transistor NMOS to a drain terminal of the N-channel transistor NMOS. As described below with reference to FIG. 4, the NMOS active inductor illustrated in FIG. 3A may replace the tenth transistor M10 and the thirteenth transistor M13 of FIG. 4.

Referring to FIG. 3B, the PMOS active inductor of FIG. 3B may include a P-channel transistor PMOS, a resistor R, and a capacitor C. The P-channel transistor PMOS may be further connected to the resistor R and the capacitor C. For example, a gate terminal of the P-channel transistor PMOS may be connected to the capacitor C and the resistor R. The capacitor C may be connected between a positive supply voltage VDD and the gate terminal. Hereinafter, for convenience of description, the terms of the positive supply voltage VDD, a supply voltage node VDD, and a supply voltage line VDD may be used interchangeably. The resistor R may connect the gate terminal to a drain terminal of the P-channel transistor PMOS. As described below with reference to FIG. 4, the PMOS active inductor illustrated in FIG. 3B may replace the fourth transistor M4 and the fifth transistor M5 of FIG. 4.

Figure 3C:
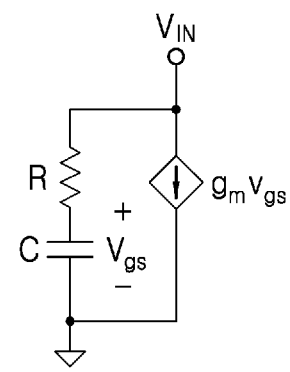
FIG. 3C illustrates a small signal equivalent circuit of a transistor including an active inductor according to example embodiments.
Figure 3D:
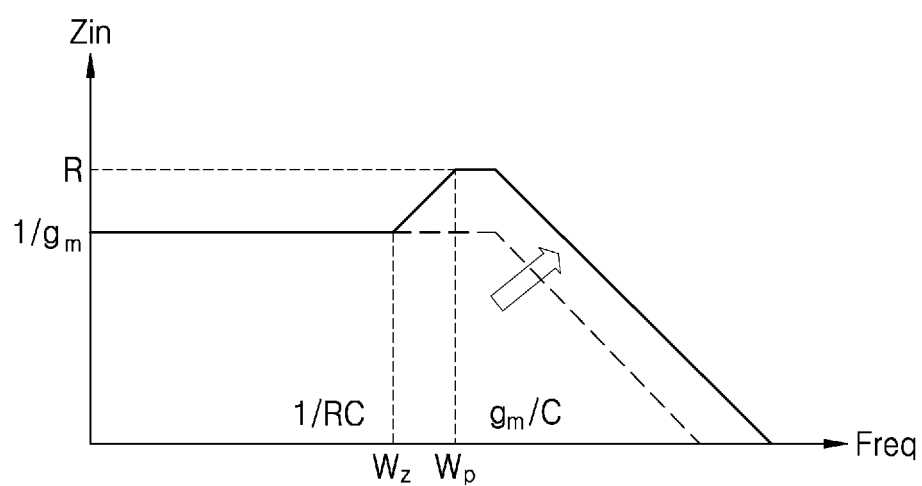
FIG. 3D illustrates a graph of a frequency and a gain according to an example embodiment of the inventive concept.

FIG. 3C illustrates a small signal equivalent circuit of a transistor including an active inductor according to example embodiments, and FIG. 3D is a graph illustrating a frequency and an input impedance (Zin) according to an example embodiment of the inventive concept.

FIG. 3C illustrates a small signal equivalent circuit of an N-channel transistor NMOS connected to the resistor R and capacitor C of FIG. 3A. Input impedance $Z_{in}$ viewed from a node to which an input voltage is applied may be summarized as follows.

$$Z_{in} = \frac{sRC + 1}{sC + g_m} \qquad \text{Equation 1}$$

Here, s represents a complex number, C represents a capacitance value, R represents resistance, and $g_m$ represents transconductance.

According to one embodiment, when a low-frequency signal or a direct current (DC) signal is input, s converges to about 0, and thus, a value of $Z_{in}$ may correspond to $1/g_m$. According to another embodiment, when a high-frequency signal is input, s converges to infinity, and thus, the value of $Z_{in}$ may correspond to R.

According to various embodiments, it can be seen that an N-channel transistor NMOS connected to the resistor R and the capacitor C of FIG. 3A inductively operates in the same manner as an inductor at a frequency of a predefined section.

The predefined section may correspond to each of a zero-point frequency and a pole point frequency of input impedance. A zero-point frequency Wz may be 1/RC, and the pole point frequency $W_p$ may be $g_m/C$. That is, when $R > 1/g_m$ is satisfied and a frequency of an input signal is greater than the zero-point frequency and less than the pole point frequency, the equivalent circuit of FIG. 3A and the equivalent circuit of FIG. 3B may operate in the same manner as an inductor.

Referring to the graph of FIG. 3D, a dashed line illustrates a change in impedance according to a change in frequency when only an N-channel transistor or a P-channel transistor is connected. When the input signal is a low-frequency signal, the input impedance Zin may correspond to $1/g_m$. Therefore, when only the N-channel transistor or the P-channel transistor is connected, there is no section ($W_z < W < W_p$) that operates as an inductor, and a frequency (i.e., bandwidth) is also reduced.

Referring to the graph of FIG. 3D, a solid line illustrates a change in input impedance Zin according to a change in frequency when the NMOS active inductor of FIG. 3A or the PMOS active inductor of FIG. 3B is connected. As described above in the small-signal equivalent circuit of FIG. 3C, it can be seen that the NMOS active inductor or the PMOS active inductor not only operates as an inductor at a frequency of a predefined section, but also increases in frequency (i.e. bandwidth).

Figure 4:
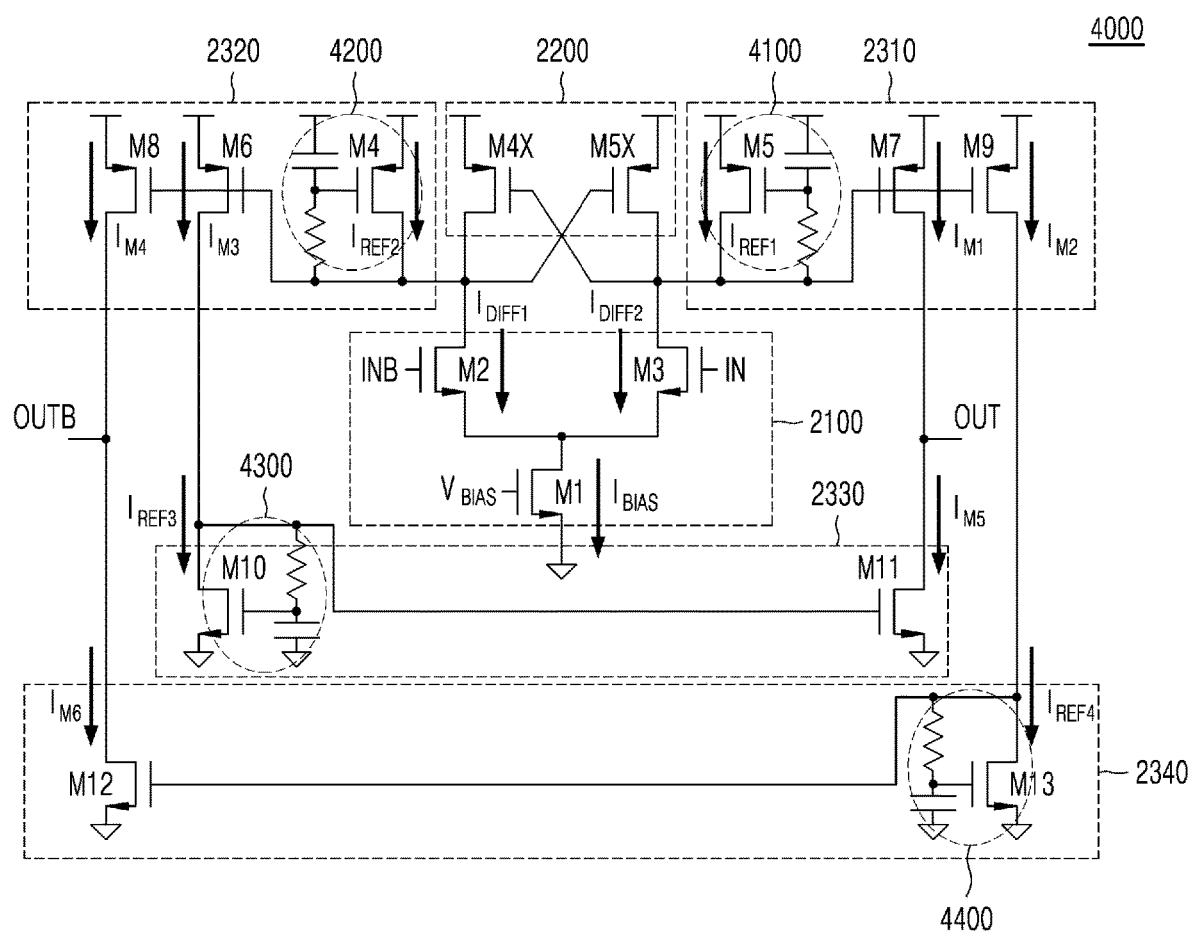
FIG. 4 illustrates an operational transconductance amplifier including an active inductor according to an example embodiment of the inventive concept.

FIG. 4 illustrates an operational transconductance amplifier 4000 including an active inductor, according to an example embodiment of the inventive concept. The operational transconductance amplifier 4000 illustrated in FIG. 4 may correspond to the first to fourth operational transconductance amplifiers 231, 221, 222, and 280 illustrated in FIG. 1B.

Referring to FIG. 4, the operational transconductance amplifier circuit 4000 according to an example embodiment of the inventive concept may further include a plurality of active inductors. For example, the operational transconductance amplifier circuit 4000 may include first, second, third, and fourth active inductors 4100, 4200, 4300, and 4400.

According to various embodiments, the first active inductor 4100 and the second active inductor 4200 may correspond to PMOS active inductors. For example, the first active inductor 4100 and the second active inductor 4200 may each include a P-channel transistor, a resistor, and a capacitor. For example, the first active inductor 4100 may include a fifth transistor M5, a resistor, and a capacitor. For example, by connecting a gate terminal of the fifth transistor M5 to the capacitor and the resistor, the fifth transistor M5 may operate as the first active inductor 4100. The first current mirror circuit 2310 may include the first active inductor 4100, the seventh transistor M7, and the ninth transistor M9. In another example, the second active inductor 4200 may include the fourth transistor M4, a resistor, and a capacitor. By connecting a gate terminal of the fourth transistor M4 to the capacitor and the resistor, the fourth transistor M4 may operate as the second active inductor 4200. The second current mirror circuit 2320 may include the second active inductor 4200, the sixth transistor M6, and the eighth transistor M8.

According to various embodiments, the third active inductor 4300 and the fourth active inductor 4400 may correspond to NMOS active inductors. For example, the third active inductor 4300 and the fourth active inductor 4400 may each include an N-channel transistor, a resistor, and a capacitor. For example, the third active inductor 4300 may include the tenth transistor M10, a resistor, and a capacitor. By connecting a gate terminal of the tenth transistor M10 to the capacitor and the resistor, the third active inductor 4300 may operate as an NMOS active inductor. The third current mirror circuit 2330 may include the third active inductor 4300 and the eleventh transistor M11. In another example, the fourth active inductor 4400 may include the thirteenth transistor M13, a resistor, and a capacitor. By connecting a gate terminal of the thirteenth transistor to the capacitor and the resistor, the fourth active inductor 4400 may operate as an NMOS active inductor. The fourth current mirror circuit 2340 may include the fourth active inductor 4400 and the twelfth transistor M12.

Figure 5:
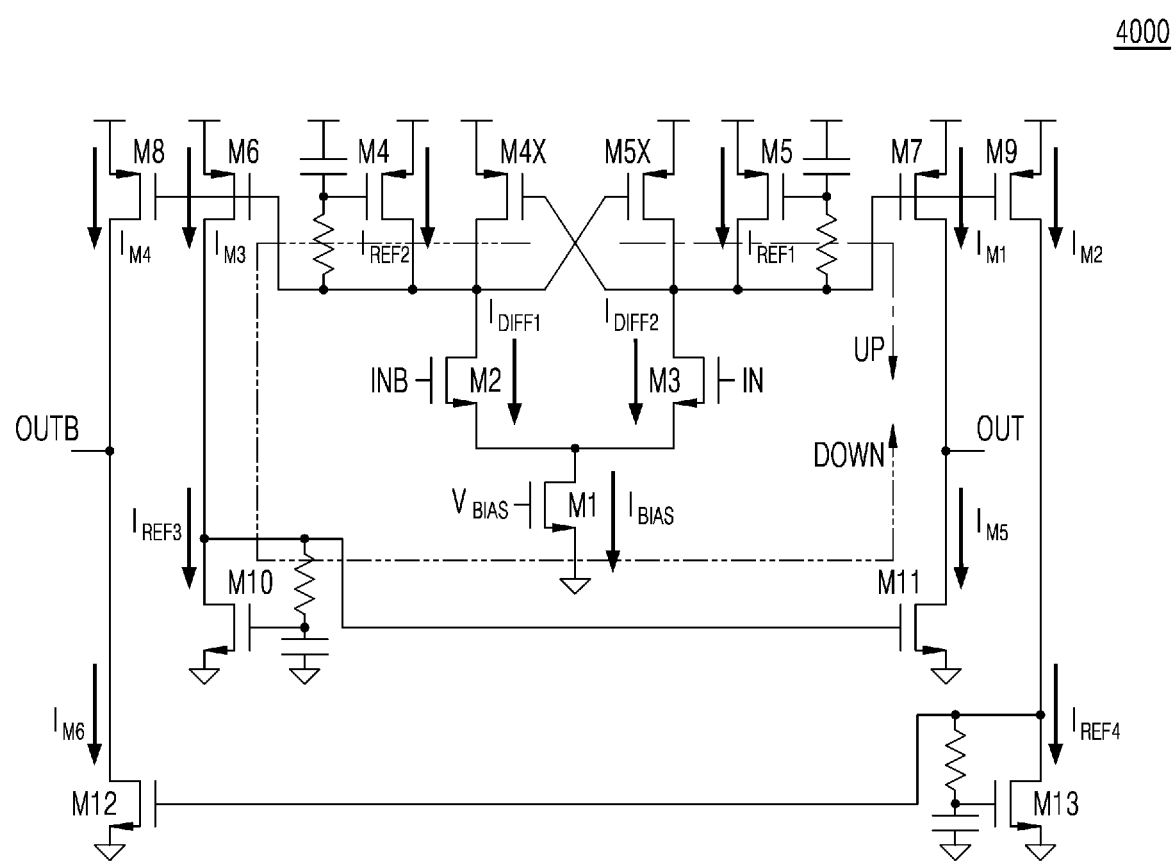
FIG. 5 illustrates electrical paths of an up current and a down current according to example embodiments of the inventive concept.

FIG. 5 illustrates electrical paths of an up current and a down current in the operational transconductance amplifier 4000 of FIG. 4 according to example embodiments of the inventive concept.

Referring to FIG. 5, the output terminal OUT may output a signal based on a difference value between an up current of a first path and a down current of a second path. For example, the output terminal OUT may output a signal based on a difference value between the first mirror current $I_{M1}$ generated through the seventh transistor M7 and the fifth mirror current $I_{M5}$ of the eleventh transistor M11.

The second transistor M2 may generate a first differential current $I_{DIFF1}$ based on an inverting input signal INB. The third transistor M3 may generate a second differential current $I_{DIFF2}$ based on an input signal IN. Hereinafter, for convenience of description, the terms of the input signal IN and an input terminal IN may be used interchangeably, and the inverting input signal INB and an inverting input terminal INB may be used interchangeably.

The second differential current $I_{DIFF2}$ may be the same as the first reference current $I_{REF1}$ generated by the fifth transistor M5 of the first current mirror circuit 2310. The seventh transistor M7 may generate a first mirror current $I_{M1}$ based on the first reference current $I_{REF1}$ of the fifth transistor M5. For example, assuming that a ratio between a width and a length of the fifth transistor M5 is the same as a ratio between a width and a length of the seventh transistor M7, the first mirror current $I_{M1}$ may be equal to the first reference current $I_{REF1}$. For example, the first path through which the first mirror current $I_{M1}$ is mirrored among two currents flowing through the output terminal OUT may correspond to an electrical path through the input terminal IN, a common drain node of the first current mirror circuit 2310, and the seventh transistor M7.

The first differential signal $I_{DIFF1}$ may be the same as the second reference current $I_{REF2}$ generated by the fourth transistor M4 of the second current mirror circuit 2320. The sixth transistor M6 may generate the third mirror current $I_{M3}$ based on the second reference current $I_{REF2}$ of the fourth transistor M4. The third mirror current $I_{M3}$ may be input to the tenth transistor M10 through the common drain node of the sixth transistor M6 and the tenth transistor M10. For example, the third mirror current $I_{M3}$ may correspond to the third reference current $I_{REF3}$ of the tenth transistor M10. The third mirror current $I_{M3}$, which is the third reference current $I_{REF3}$, may be mirrored by the fifth mirror current $I_{M5}$ of the eleventh transistor M11. For example, the second path through which the fifth mirror current $I_{M5}$ is mirrored among two currents flowing through the output terminal OUT may correspond to an electrical path through the inverting input terminal INB, a common drain node of the second current mirror circuit 2320, the sixth transistor M6, the tenth transistor M10, and the eleventh transistor M11.

The first current mirror circuit 2310 may generate the first mirror current $I_{M1}$ based on the second differential current $I_{DIFF2}$ and output the first mirror current $I_{M1}$ via the output terminal OUT. The second current mirror circuit 2320 may generate the third mirror current $I_{M3}$ based on the first differential current $I_{DIFF1}$ and output the third mirror current $I_{M3}$ via the gate terminal of the eleventh transistor M11 of a third current mirror circuit 2330. The third current mirror circuit 2330 may generate the fifth mirror current $I_{M5}$ based on the third mirror current $I_{M3}$ and output the fifth mirror current $I_{M5}$ via the output terminal OUT.

In the above-described embodiment, an up current of a first path and a down current of a second path are illustrated with respect to the output terminal OUT, but the inventive concept is not limited thereto. An inverting output terminal OUTB may output a signal based on a difference value between an up current of a third path and a down current of a fourth path. For example, the fourth current mirror circuit 2340 may generate the sixth mirror current $I_{M6}$ based on the second mirror current $I_{M2}$ and output the sixth mirror current $I_{M6}$ via the inverting output terminal OUTB.

The differential input circuit 2100 may include a first stage and a second stage. For example, the first stage may include the second transistor M2, and the second stage may include the third transistor M3.

The first stage of the differential input circuit 2100 may output the first differential current $I_{DIFF1}$ according to the inverting input signal INB. The feedback circuit 2200 may amplify the first differential current $I_{DIFF1}$ based on the inverting input signal INB.

For example, the second transistor M2 may generate the first differential current $I_{DIFF1}$ according to the inverting input signal INB. The first differential signal $I_{DIFF1}$ may be equal to the second reference current $I_{REF2}$ generated by the fourth transistor M4 of the second current mirror circuit 2320. The eighth transistor M8 may generate the fourth mirror current $I_{M4}$ based on the second reference current $I_{REF2}$ of the fourth transistor M4. The fourth mirror current $I_{M4}$ may correspond to the up current of the third path. For example, the third path may include the inverting input terminal INB, a common drain node of the second current mirror circuit 2320, the eighth transistor M8, and the inverting output terminal OUTB.

The second stage of the differential input circuit 2100 may output the second differential current $I_{DIFF2}$ according to the input signal IN. The feedback circuit 2200 may amplify the second differential current $I_{DIFF2}$ based on the input signal IN.

For example, the third transistor M3 may generate the second differential current $I_{DIFF2}$ according to the input signal IN. The second differential signal $I_{DIFF2}$ may be equal to the first reference current $I_{REF1}$ generated by the fifth transistor M5 of the first current mirror circuit 2310. The ninth transistor M9 may generate the second mirror current $I_{M2}$ based on the first reference current $I_{REF1}$ of the fifth transistor M5. The second mirror current $I_{M2}$ may be input as the fourth reference current $I_{REF4}$ of the thirteenth transistor M13 through a drain node shared by the thirteenth transistor M13 and the ninth transistor M9. The twelfth transistor M12 may generate the sixth mirror current $I_{M6}$ based on the fourth reference current $I_{REF4}$ of the thirteenth transistor M13. The sixth mirror current $I_{M6}$ may correspond to the down current of the fourth path. For example, the fourth path may include the input terminal IN, a common drain node of the first current mirror circuit 2310, the ninth transistor M9, the thirteenth transistor M13, the twelfth transistor M12, and the inverting output terminal OUTB.

Herein, the input signal IN and the inverting input signal INB may correspond to a signal pair of a clock signal CLK and an inverted clock signal CLKB, a signal pair of a data strobe signal DQS and an inverted data strobe signal DQSB, a signal pair of an address ADDR and an inverted address ADDRB, or a signal pair of a data DQ and an inverted data DQB.

According to various embodiments, a mismatch may occur between the up current and the down current. In the mismatch, the up current and the down current may flow through different electrical paths. For example, the up current of the first path may be input to the output terminal OUT through current mirroring (first current mirror circuit 2310) once, and the down current of the second path may be input to the output terminal OUT through current mirroring (the second current mirror circuit 2320 and the third current mirror circuit 2330) twice. For example, the up current of the first path may be output via the output terminal OUT through the current mirroring (first current mirror circuit 2310) once, and the down current of the second path may be output via the output terminal OUT through the current mirroring (the second current mirror circuit 2320 and the third current mirror circuit 2330) twice.

Figure 6A:
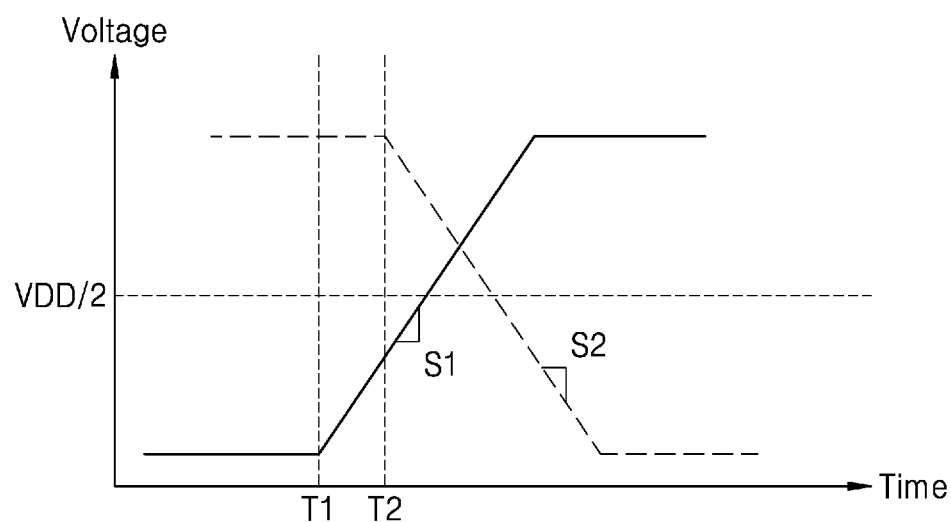
FIG. 6A is a graph illustrating distortion of a duty cycle according to a comparative example.

FIG. 6A is a graph illustrating distortion of a duty cycle according to a comparative example.

Referring to FIG. 6A, a graph of a transient response of up and down current is illustrated. The horizontal axis represents time, and the vertical axis represents voltage.

The operational transconductance amplifier circuit 2000 of FIG. 2 may cause a duty cycle error. Referring to the up current and the down current of FIG. 5 together, the operational transconductance amplifier circuit 2000 of FIG. 2 has different lengths of electrical paths of the up current and the down current. Specifically, the up current may correspond to a current mirrored once through the first current mirror circuit 2310, while the down current may correspond to a current mirrored twice through the second current mirror circuit 2320 and the third current mirror circuit 2330. The number of mirrorings is changed, and thus, a point in time at which the up current starts a transition may precede a point in time at which the down current starts a transition. That is, a voltage of the output terminal OUT at a point in time when the up current is equal to the down current may not correspond to half of the positive supply voltage VDD. That is, the up current is switched with the down current when the voltage of the output terminal OUT is not half of the positive supply voltage VDD, and thus, a duty cycle error may occur. The duty cycle error may occur due to a difference between the voltage of the output terminal OUT and half of the positive supply voltage VDD at a point in time when the up current crosses the down current.

Figure 6B:
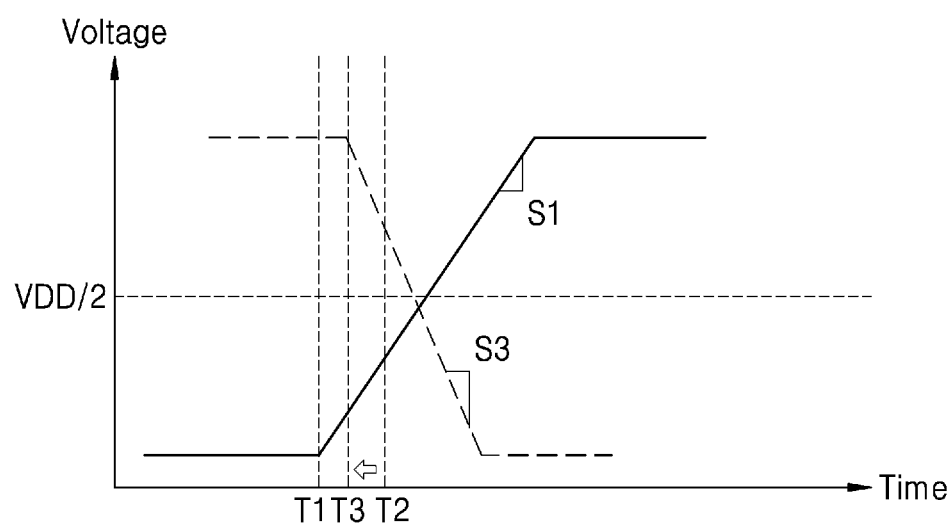
FIG. 6B is a graph illustrating a reduction in distortion of a duty cycle based on an NMOS active inductor according to example embodiments.
Figure 6C:
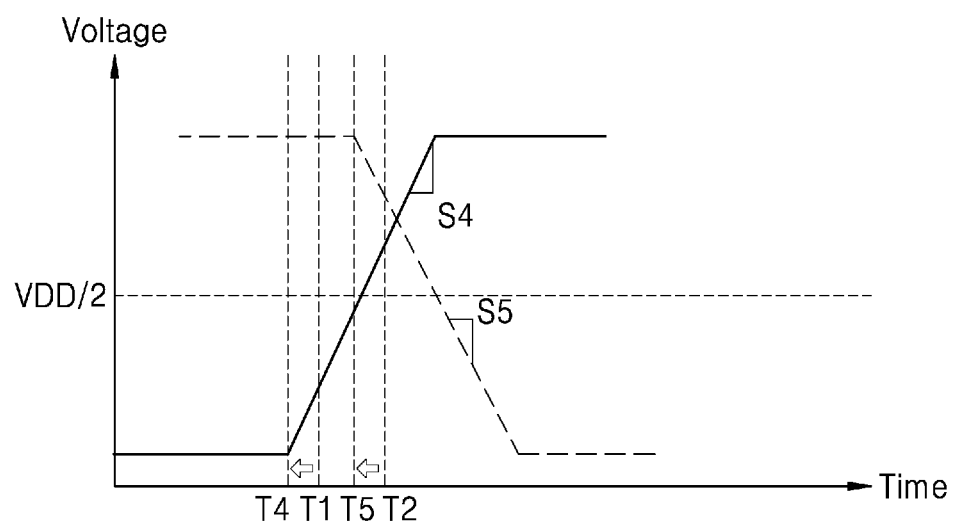
FIG. 6C is a graph illustrating a reduction in distortion of a duty cycle based on a PMOS active inductor according to example embodiments.
Figure 6D:
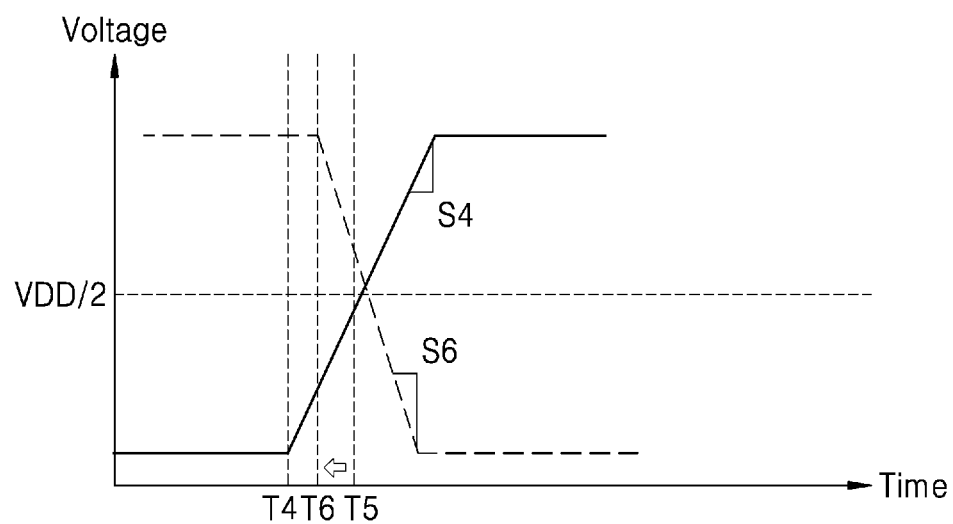
FIG. 6D is a graph illustrating a reduction in distortion of a duty cycle based on an NMOS active inductor and a PMOS active inductor according to example embodiments of the inventive concept.

FIG. 6B is a graph illustrating a reduction in distortion of a duty cycle based on an NMOS active inductor according to example embodiments, FIG. 6C is a graph illustrating a reduction in distortion of a duty cycle based on a PMOS active inductor according to example embodiments, and FIG. 6D is a graph illustrating a reduction in distortion of a duty cycle based on the NMOS active inductor and the PMOS active inductor according to an example embodiment of the inventive concept.

FIG. 6B may be a graph corresponding to the operational transconductance amplifier circuit 4000 including only an NMOS active inductor. For example, referring to FIG. 4 together, FIG. 6B illustrates correction in the duty cycle error in a case where the third current mirror circuit 2330 and the fourth current mirror circuit 2340 respectively include the third active inductor 4300 and the fourth active inductor 4400.

According to various embodiments, when referring to FIG. 5 together, the up current may correspond to a current mirrored once through the first current mirror circuit 2310. Accordingly, the point in time at which the up current of FIG. 6B starts a transition is not changed, and a transition slope of the up current may not change. The down current may correspond to a current mirrored twice through the second current mirror circuit 2320 and the third current mirror circuit 2330. Accordingly, a point in time at which the down current starts a transition based on the third active inductor 4300 of the third current mirror circuit 2330 may be moved forward, and a transition slope of the down current may also be increased.

FIG. 6C may be a graph corresponding to the operational transconductance amplifier circuit 4000 including only a PMOS active inductor. For example, when referring to FIG. 4 together, FIG. 6C illustrates correction in the duty cycle error in a case where the first current mirror circuit 2310 and the second current mirror circuit 2320 respectively include the first active inductor 4100 and the second active inductor 4200.

According to various embodiments, when referring to FIG. 5 together, the up current may correspond to a current mirrored once through the first current mirror circuit 2310. Accordingly, a point in time at which the up current of FIG. 6C starts a transition based on the first active inductor 4100 may be moved forward, and a transition slope of the up current may also be increased. In addition, the down current may correspond to a current mirrored twice through the second current mirror circuit 2320 and the third current mirror circuit 2330. Accordingly, a point in time at which the down current starts a transition based on the second active inductor 4200 of the second current mirror circuit 2320 may be moved forward, and a transition slope of the down current may also be increased. However, as illustrated in FIG. 6A, even though a duty cycle error occurs due to a fast transition time of the up current, duty cycles of the up current and the down current are improved by using an active inductor once, and it can be seen that the duty cycle error is still maintained.

FIG. 6D may be a graph corresponding to the operational transconductance amplifier circuit 4000 that includes both a PMOS active inductor and an NMOS active inductor. For example, referring to FIG. 4 together, FIG. 6D illustrates correction in the duty cycle error in a case where the first current mirror circuit 2310 to the fourth current mirror circuit 2340 respectively include the first active inductor 4100 to the fourth active inductor 4400.

As in FIG. 6C, a point in time at which the up current starts a transition based on the first active inductor 4100 may be moved forward, and a transition slope of the up current may also be increased. However, a duty cycle error of the down current may be corrected by using two active inductors corresponding to the second active inductor 4200 of the second current mirror circuit 2320 and the third active inductor 4300 of the third current mirror circuit 2330. For example, the down current of FIG. 6D may have a faster transition point in time and may further increase in transition slope compared to the down current of FIG. 6B. For example, as transition characteristics are improved by using two active inductors, a duty cycle error between the down current and the up current may be corrected.

Figure 7A:
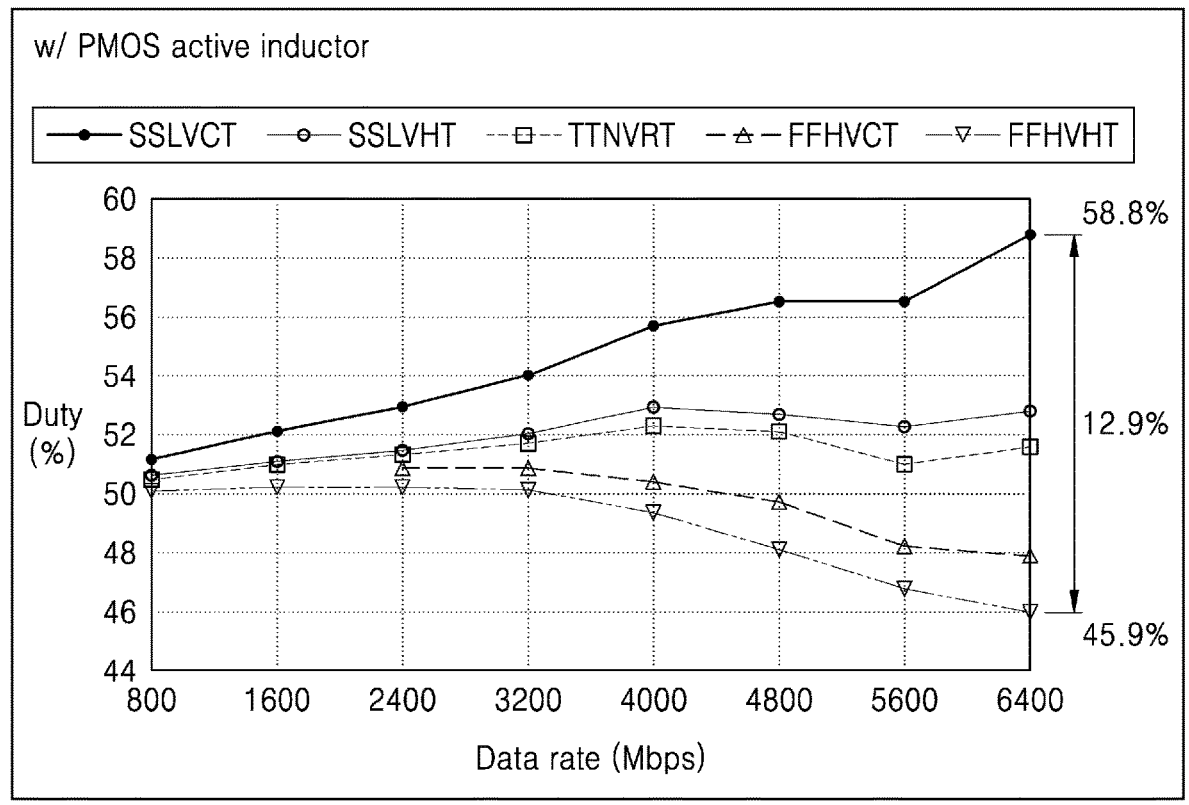
FIG. 7A is a graph illustrating distortion of a duty cycle when only a PMOS active inductor is included.

FIG. 7A is a graph illustrating distortion of a duty cycle when only a PMOS active inductor is included.

Referring to FIG. 7A, the operational transconductance amplifier circuit 4000 may include only a PMOS active inductor.

Referring to FIG. 4 together, the first current mirror circuit 2310 may include the first active inductor 4100, the seventh transistor M7, and the ninth transistor M9. The first active inductor 4100 may correspond to a PMOS active inductor. The second current mirror circuit 2320 may include the second active inductor 4200, the sixth transistor M6, and the eighth transistor M8. The second active inductor 4200 may correspond to a PMOS active inductor. The third current mirror circuit 2330 may include only the tenth transistor M10 and the eleventh transistor M11 without the third active inductor 4300, and the fourth current mirror circuit 2340 may include only the twelfth transistor M12 and the thirteenth transistor M13 without the fourth active inductor 4400. That is, the third current mirror circuit 2330 and the fourth current mirror circuit 2340 may not include capacitors and resistors.

FIG. 7A illustrates a result of performing a variation of process, voltage, and temperature (PVT) according to various embodiments. The horizontal axis may correspond to a data rate indicating a transmission rate. The vertical axis may indicate whether or not duty cycles match each other. When the duty cycles are match, the duty rate (i.e., match) may be 50%.

According to various embodiments, "SSLVCT" indicates a degree of match between duty cycles according to an increase in data rate in an environment in which a P-channel transistor of an active inductor is slow (SS), a supply voltage is low (LV), and an operation temperature is low (CT). When the data rate is as low as 800, a match between an up current and a down current may correspond to 51. However, when a data rate is increased to 6400, the match between the up current and the down current may increase to 58.8.

According to various embodiments, "FFHVHT" indicates a degree of match between duty cycles according to an increase in data rate in an environment in which a P-channel transistor of an active inductor is fast (FF), a supply voltage is high (HV), and an operation temperature is high (HT). When a data rate is as low as 800, a match between an up current and a down current may correspond to 50. However, when a data rate is increased to 6400, the match between the up current and the down current may decrease to 45.9. That is, a difference between duty cycle matches in "FFHVHT" and "SSLVCT" may be as wide as 12.9.

Figure 7B:
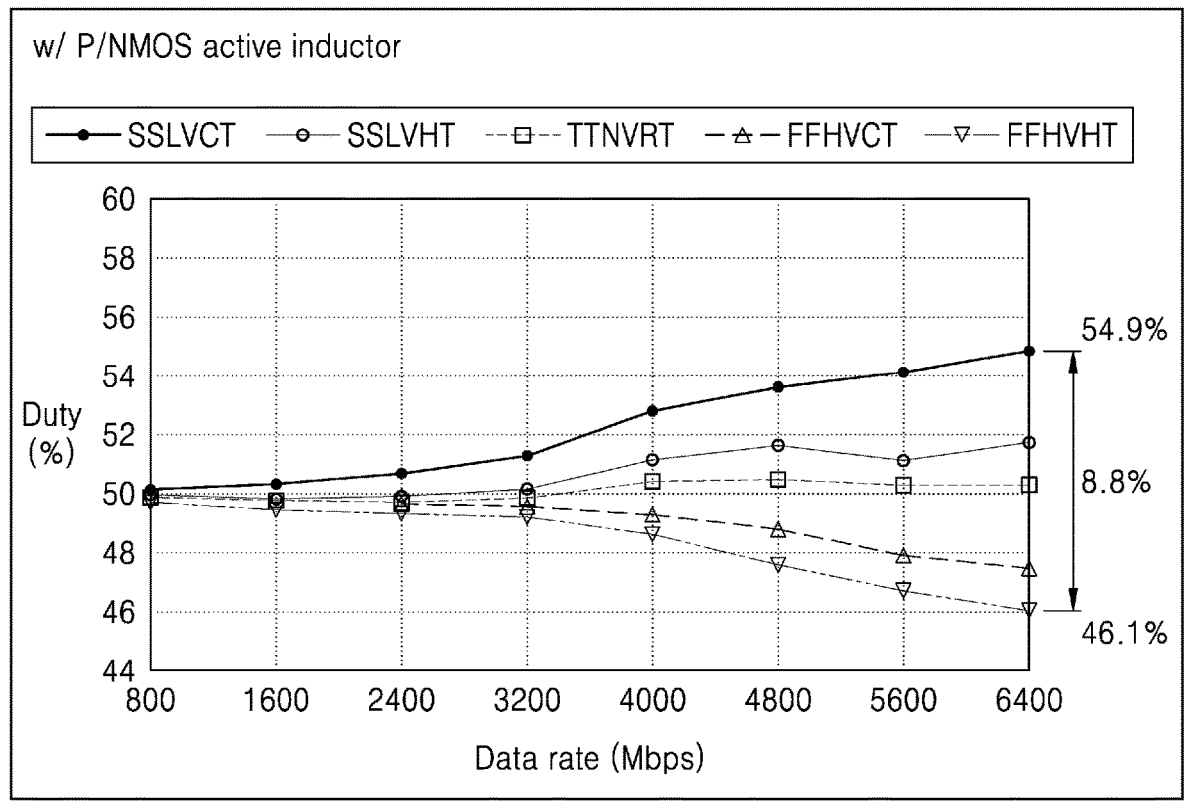
FIG. 7B is a graph illustrating distortion of a duty cycle when both an NMOS active inductor and a PMOS active inductor are included according to example embodiments of the inventive concept.

FIG. 7B is a graph illustrating distortion of a duty cycle when both an NMOS active inductor and a PMOS active inductor are included according to example embodiments of the inventive concept.

Referring to FIG. 7B, the operational transconductance amplifier circuit 4000 may include both a PMOS active inductor and an NMOS active inductor.

Referring to FIG. 4 together, the first current mirror circuit 2310 may include the first active inductor 4100, the seventh transistor M7, and the ninth transistor M9. The second current mirror circuit 2320 may include the second active inductor 4200, the sixth transistor M6, and the eighth transistor M8. The third current mirror circuit 2330 may include the third active inductor 4300 and the eleventh transistor M11, and the fourth current mirror circuit 2340 may include the twelfth transistor M12 and the fourth active inductor 4400. For example, all of the first current mirror circuit 2310 to the fourth current mirror circuit 2340 may include capacitors and resistors.

According to various embodiments, "SSLVCT" indicates a degree of match between duty cycles according to an increase in data rate in an environment in which a transistor of an NMOS active inductor and a transistor of a PMOS active inductor are slow (SS), a supply voltage is low (LV), and an operation temperature is low (CT). When a data rate is as low as 800, a match between an up current and a down current may correspond to 50. However, when the data rate is increased to 6400, the match between the up current and the down current may increase to 54.9.

According to various embodiments, "FFHVHT" indicates a degree of match between duty cycles according to an increase in data rate in an environment in which a transistor of an NMOS active inductor and a transistor of a PMOS active inductor are fast (FF), a supply voltage is high (HV), and an operation environment is high (HT). When a data rate is as low as 800, a match between an up current and a down current may correspond to 50. However, when the data rate is increased to 6400, the match between the up current and the down current may decrease to 46.1. That is, a difference between duty cycle matches in "FFHVHT" and "SSLVCT" may be as wide as 8.8. According to example embodiments of the inventive concept, it can be seen that duty cycle mismatch between an up current and a down current may be reduced as a data rate increases when both the PMOS active inductor and the NMOS active inductor are included, rather than when only the PMOS active inductor is included or when only the NMOS active inductor is included.

Figure 8:
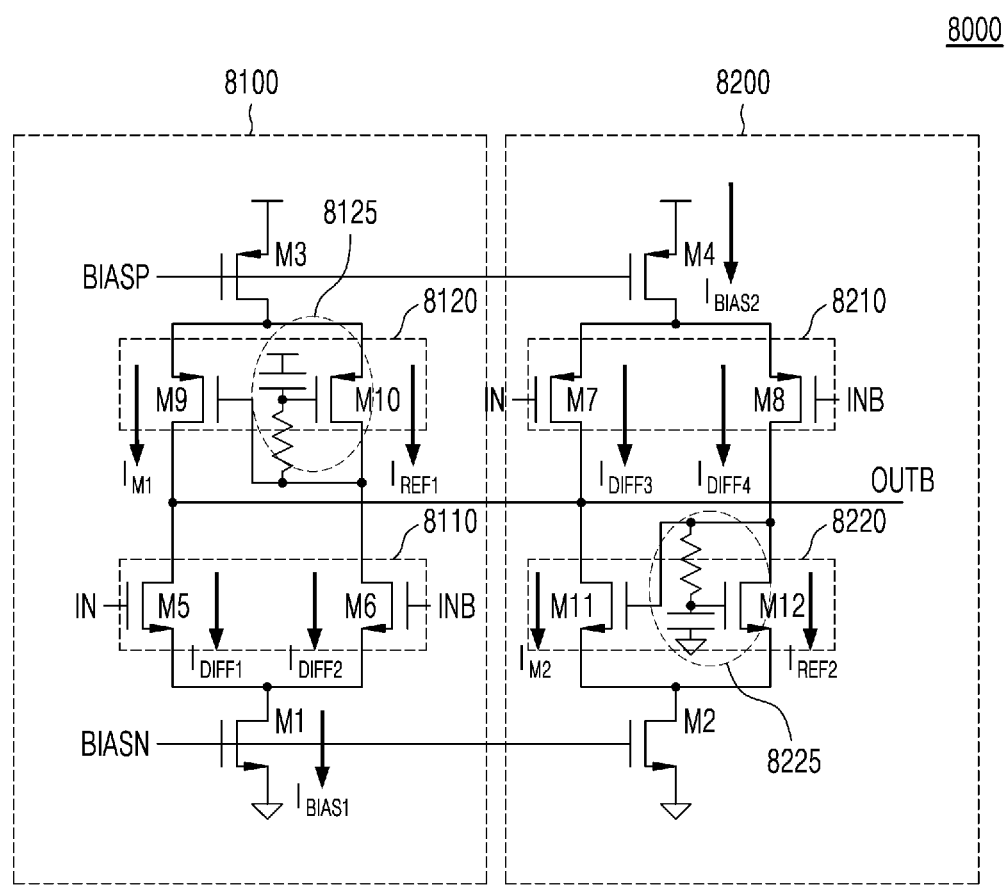
FIG. 8 illustrates an amplifier circuit including an NMOS active inductor and a PMOS active inductor according to example embodiments of the inventive concept.

FIG. 8 illustrates an amplifier circuit including an NMOS active inductor and a PMOS active inductor according to example embodiments of the inventive concept.

Referring to FIG. 8, an amplifier circuit 8000 may correspond to a differential input-single ended output amplifier.

The amplifier circuit 8000 according to various embodiments may include a first unit circuit 8100 and a second unit circuit 8200. The first unit circuit 8100 may be referred to as an N-type amplifier. The second unit circuit 8200 may be referred to as a P-type amplifier. The amplifier circuit 8000 including the first unit circuit 8100 and the second unit circuit 8200 may be referred to as an NP-type amplifier.

The first unit circuit 8100 may include a first transistor M1 and a third transistor M3 for generating a bias current. The first transistor M1 may correspond to an N-channel transistor, and the third transistor M3 may correspond to a P-channel transistor. A first bias voltage BIASN may be input to a gate terminal of the first transistor M1. The first transistor M1 may generate a first bias current $I_{BIAS1}$ based on the first bias voltage BIASN. A second bias voltage BIASP may be set to be equal to a threshold voltage of the third transistor M3. Accordingly, the third transistor M3 may be turned on to connect a positive supply voltage VDD to source nodes of a ninth transistor M9 and a tenth transistor M10.

The first unit circuit 8100 may include a first differential input circuit 8110. The first differential input circuit 8110 may include a fifth transistor M5 and a sixth transistor M6. The fifth transistor M5 and the sixth transistor M6 may correspond to N-channel transistors. The fifth transistor M5 and the sixth transistor M6 may receive a differential input pair. For example, the fifth transistor M5 may receive a clock signal CLK, and at the same time, the sixth transistor M6 may receive an inverted clock signal CLKB. The fifth transistor M5 may generate a first differential current $I_{DIFF1}$ based on a differential input signal received through an input terminal IN. The sixth transistor M6 may generate a second differential current $I_{DIFF2}$ based on a differential input signal received through an inverting input terminal INB. The sum of the first differential current $I_{DIFF1}$ and the second differential current $I_{DIFF2}$ may correspond to a magnitude of the first bias current $I_{BIAS1}$.

The first unit circuit 8100 may include a first current mirror circuit 8120. The first current mirror circuit 8120 may include a ninth transistor M9 and a PMOS active inductor 8125. The PMOS active inductor 8125 may include a tenth transistor M10, a resistor, and a capacitor. A gate terminal of the tenth transistor M10 may be connected to the resistor and the capacitor of the PMOS active inductor 8125. The resistor of the PMOS active inductor 8125 may be connected between the gate terminal of the tenth transistor M10 and a drain terminal of the tenth transistor M10. The capacitor of the PMOS active inductor 8125 may be connected between the gate terminal of the tenth transistor M10 and a positive supply voltage VDD. The drain terminal of the tenth transistor M10 may be connected to a gate terminal of the ninth transistor M9. The tenth transistor M10 may share a drain node with the sixth transistor M6. Accordingly, the second differential current $I_{DIFF2}$ generated by the sixth transistor M6 may be equal to the first reference current $I_{REF1}$ of the tenth transistor M10. The ninth transistor M9 may generate a first mirror current $I_{M1}$ based on a first reference current $I_{REF1}$ of the tenth transistor M10. An inverting output terminal OUTB may output a signal based on a difference between the first mirror current $I_{M1}$ and the first differential current $I_{DIFF1}$.

The second unit circuit 8200 may include a second transistor M2 and a fourth transistor M4 for generating a bias current. The second transistor M2 may correspond to an N-channel transistor, and the fourth transistor M4 may correspond to a P-channel transistor. The first bias voltage BIASN may be input to a gate terminal of the second transistor M2. A threshold voltage of the second transistor M2 may be set to be equal to the first bias voltage BIASN. Accordingly, the second transistor M2 may be turned on to connect a source node of an eleventh transistor M11 to a ground node GND. The fourth transistor M4 may generate a second bias current $I_{BIAS2}$ based on the second bias voltage BIASP.

The second unit circuit 8200 may include a second differential input circuit 8210. The second differential input circuit 8210 may include a seventh transistor M7 and an eighth transistor M8. Each of the seventh transistor M7 and the eighth transistor M8 may correspond to a P-channel transistor. The seventh transistor M7 and the eighth transistor M8 may receive a differential input pair. The seventh transistor M7 may generate a third differential current $I_{DIFF3}$ based on a differential input signal received through the input terminal IN. The eighth transistor M8 may generate a fourth differential current $I_{DIFF4}$ based on a differential input signal received through the inverting input terminal INB. The sum of the third differential current $I_{DIFF3}$ and the fourth differential current $I_{DIFF4}$ may correspond to a magnitude of the second bias current $I_{BIAS2}$.

The second unit circuit 8200 may include a second current mirror circuit 8220. The second current mirror circuit 8220 may include an eleventh transistor M11 and an NMOS active inductor 8225. The NMOS active inductor 8225 may include a twelfth transistor M12, a resistor, and a capacitor. A gate terminal of the twelfth transistor M12 may be connected to the resistor and the capacitor of the NMOS active inductor 8225. The resistor of the NMOS active inductor 8225 may be connected between the gate terminal of the twelfth transistor M12 and a drain terminal of the twelfth transistor M12. The capacitor of the NMOS active inductor 8225 may be connected between the gate terminal of the twelfth transistor M12 and the ground node GND. The drain terminal of the twelfth transistor M12 may be connected to a gate terminal of the eleventh transistor M11. The twelfth transistor M12 may share a drain node with the eighth transistor M8. Accordingly, the fourth differential current $I_{DIFF4}$ generated by the eighth transistor M8 may be equal to a second reference current $I_{REF2}$ of the twelfth transistor M12. The eleventh transistor M11 may generate a second mirror current $I_{M2}$ based on the second reference current $I_{REF2}$ of the twelfth transistor M12. The inverting output terminal OUTB may output a signal based on a difference between the second mirror current $I_{M2}$ and the third differential current $I_{DIFF3}$.

Figure 9:
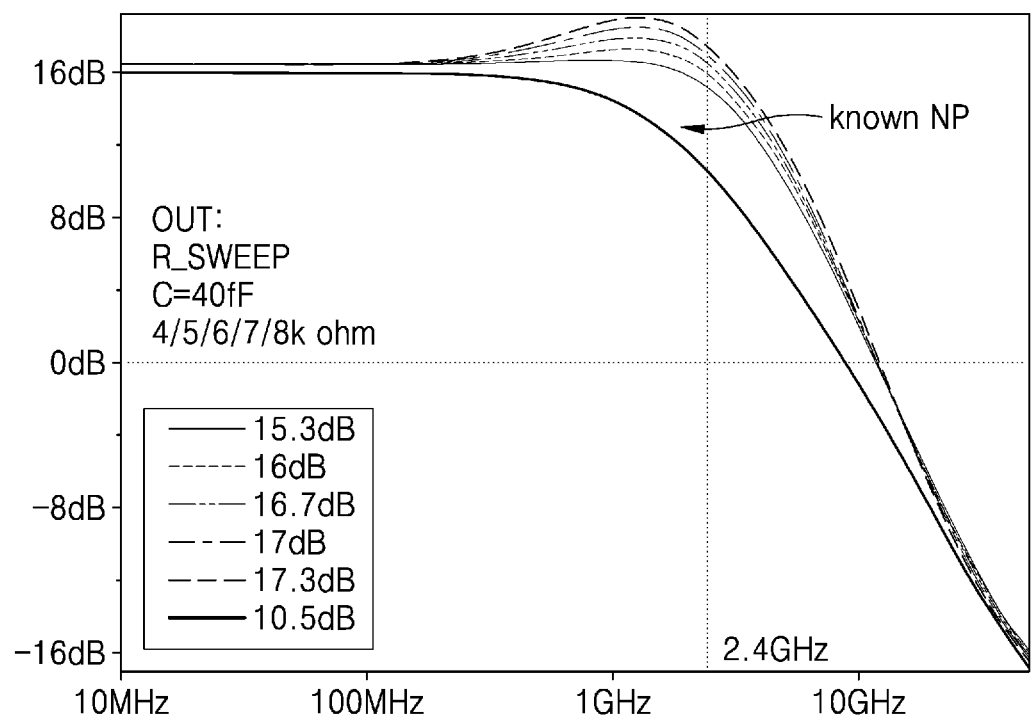
FIG. 9 is a graph illustrating a frequency and a gain according to example embodiments of the inventive concept.

FIG. 9 is a graph illustrating a frequency and a gain according to example embodiments of the inventive concept.

A relationship between a frequency and a gain using a plurality of resistor values is illustrated in FIG. 9. It is assumed that a capacitance C of each of the NMOS active inductor 8225 and the PMOS active inductor 8125 included in the amplifier circuit 8000 of FIG. 8 is 40 fF. When a resistance value of each of the NMOS active inductor 8225 and the PMOS active inductor 8125 is 8 KΩ, it can be seen that the gain increases by 2 dB compared to a case in which the resistance value is 4 KΩ. For example, when the resistance value is 4 KΩ, the maximum gain is about 17 dB and when the resistance value is 8 KΩ, the maximum gain is about 19 dB. In FIG. 9, when an operation frequency is 2.4 GHz and the resistance values are 4 KΩ, 5 KΩ, 6 KΩ, 7 KΩ, and 8 KΩ, the gains are respectively about 15.3 dB, 16 dB, 16.7 dB, 17 dB, and 17.3 dB. The term such as "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In a known NP-type amplifier circuit that does not include the NMOS active inductor 8225 and the PMOS active inductor 8125, a bandwidth referring to a frequency corresponding to 0 dB may correspond to 8.77 GHz. According to various embodiments, it can be seen that the amplifier circuit 8000 of FIG. 8 including the NMOS active inductor 8225 and the PMOS active inductor 8125 has a bandwidth of 11.7 GHz increased by about 33%.

According to various embodiments, when an operation frequency is 2.4 GHz, the known NP-type amplifier circuit may have a gain of 10.5 dB, and it can be seen that the amplifier circuit 8000 of FIG. 8 including the NMOS active inductor 8225 and the PMOS active inductor 8125 has a gain range of about 15.3 dB~17.3 dB increased by about 46%~65%.

Figure 10:
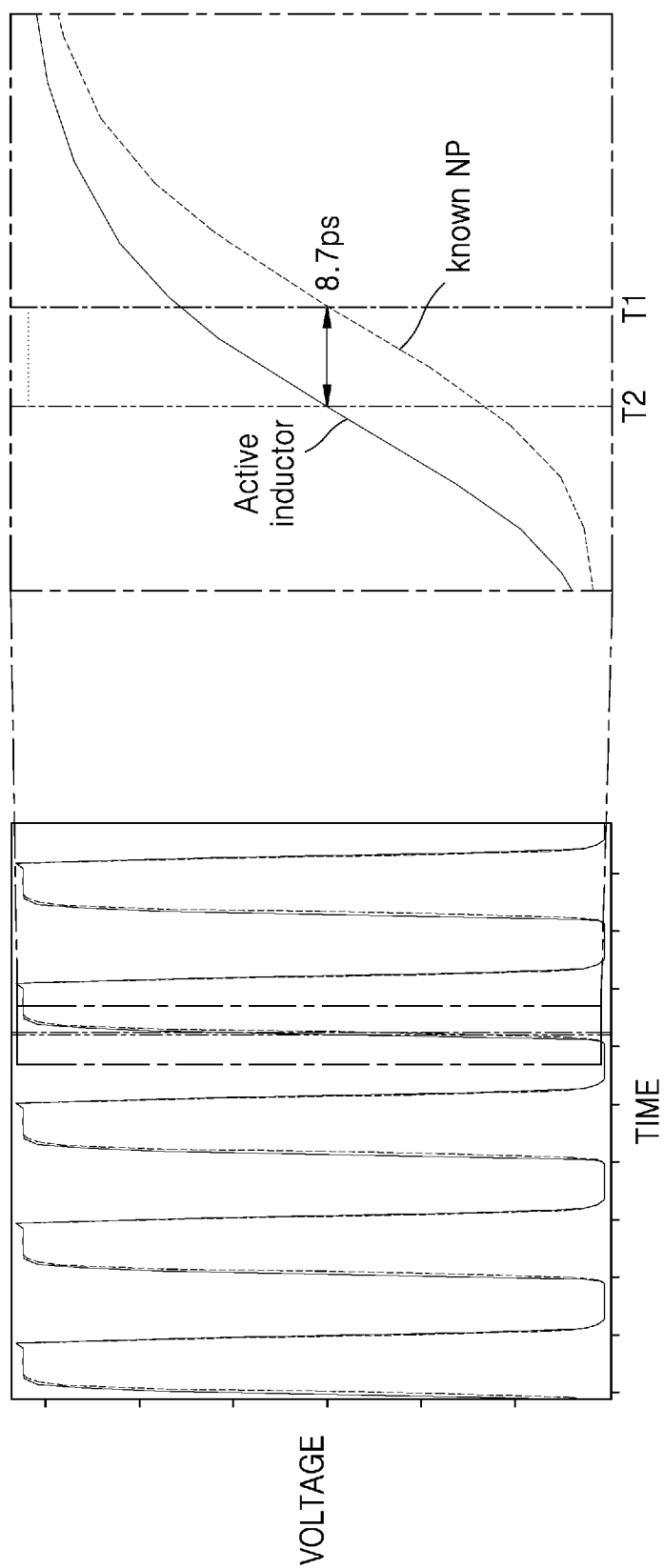
FIG. 10 is a graph illustrating improvement of a slew rate according to example embodiments of the inventive concept.

FIG. 10 is a graph illustrating an increase in slew rate according to example embodiments of the inventive concept.

FIG. 10 illustrates a transition simulation result of the known NP-type amplifier circuit and a transition simulation result of the amplifier circuit 8000 of FIG. 8 including the NMOS active inductor 8225 and the PMOS active inductor 8125.

A point in time at which an output signal of the known NP-type amplifier circuit reaches half of a transient response value is referred to as a point in time T1. A point in time at which an output signal of the amplifier circuit 8000 of FIG. 8 reaches half of the transient response value is referred to as a point in time T2. As illustrated in FIG. 10, it can be seen that the point in time T2 precedes the point in time T1 by 8.7 ps.

For example, in the amplifier circuit 8000 including the PMOS active inductor 8125 and the NMOS active inductor 8225, an RL circuit may be formed in a frequency bandwidth in which the active inductor operates, and it can be seen that the characteristics of a transient response are improved and a slew rate is increased according to characteristics of a low pass filter (LPF) of the RL circuit.

While the inventive concept has been particularly illustrated and described with reference to embodiments thereof, it will be understood that various changes in form and details may be made therein without departing from the spirit and scope of the following claims.

What is claimed is:

1. An operational transconductance amplifier comprising:
    an input circuit configured to generate a first differential current and a second differential current based on a pair of differential input signals;

a first current mirror circuit configured to generate a first mirror current based on the first differential current and output the first mirror current via a first output terminal; and a second current mirror circuit configured to generate a second mirror current based on the second differential current and output the second mirror current via a first node of a third current mirror circuit, wherein the second current mirror circuit and the third current mirror circuit are connected to each other through the first node, wherein the third current mirror circuit is configured to generate a third mirror current based on the second mirror current and output the third mirror current via the first output terminal, wherein the first current mirror circuit and the second current mirror circuit respectively comprise a first active inductor and a second active inductor each including a P-channel transistor, a capacitor, and a resistor connected to each other, and wherein the third current mirror circuit comprises a third active inductor including an N-channel transistor, a capacitor and a resistor connected to each other.

2. The operational transconductance amplifier of claim 1, wherein the input circuit includes a first input stage and a second input stage, and the operational transconductance amplifier further comprising:

a feedback circuit configured to electrically connect the first current mirror circuit to the second current mirror circuit and amplify gains of the first input stage and the second input stage.

3. The operational transconductance amplifier of claim 1, further comprising:

a fourth current mirror circuit configured to generate a fifth mirror current based on a fourth mirror current, and output the fifth mirror current via a second output terminal, wherein the fourth mirror current is generated by the first current mirror circuit based on the first differential current, and wherein the fourth current mirror circuit is connected to the second output terminal and comprises a fourth active inductor including an N-channel transistor, a capacitor, and a resistor connected to each other.

4. The operational transconductance amplifier of claim 3, wherein the second current mirror circuit is configured to further generate a sixth mirror current based on the second differential current and output the sixth mirror current via the second output terminal.

5. The operational transconductance amplifier of claim 4, wherein the operational transconductance amplifier is configured to output an output signal via the first output terminal based on a difference between the first mirror current and the third mirror current.

6. The operational transconductance amplifier of claim 4, wherein the operational transconductance amplifier is configured to output an output signal via the second output terminal based on a difference between the fifth mirror current and the sixth mirror current.

7. The operational transconductance amplifier of claim 6, wherein each of the first mirror current and the sixth mirror current corresponds to a current generated through current mirroring once, and wherein each of the third mirror current and the fifth mirror current corresponds to a current generated through current mirroring twice.

8. The operational transconductance amplifier of claim 7, wherein the operational transconductance amplifier is configured such that:

a duty cycle of the first mirror current matches a duty cycle of the third mirror current, and a duty cycle of the sixth mirror current matches a duty cycle of the fifth mirror current.

9. The operational transconductance amplifier of claim 4, wherein the first current mirror circuit further comprises a first P-channel transistor configured to generate the first mirror current and a second P-channel transistor configured to generate the fourth mirror current, wherein the first P-channel transistor is electrically connected to the first output terminal, and wherein the second P-channel transistor forms a common drain node with the fourth active inductor of the fourth current mirror circuit.

10. The operational transconductance amplifier of claim 4, wherein the second current mirror circuit further comprises a third P-channel transistor configured to generate the second mirror current and a fourth P-channel transistor configured to generate the sixth mirror current, wherein the fourth P-channel transistor is electrically connected to the second output terminal, and wherein the third P-channel transistor forms a common drain node with the third active inductor of the third current mirror circuit.

11. A memory device comprising:

a memory cell array including multiple memory blocks that each include a plurality of memory cells connected to word lines and bit lines arranged in rows and columns, and configured to perform a write operation and a read operation for the plurality of memory cells by using an internal power supply voltage; and a clock buffer configured to receive a pair of differential input signals having a clock signal and an inverted clock signal and correct a duty cycle of the clock signal, wherein the clock buffer comprises:

an input circuit configured to generate a first differential current and a second differential current based on the clock signal and the inverted clock signal;

a first current mirror circuit including a first active inductor including a P-channel transistor and configured to generate a first mirror current and a second mirror current based on the first differential current;

a second current mirror circuit including a second active inductor including a P-channel transistor and configured to generate a third mirror current and a fourth mirror current based on the second differential current;

a third current mirror circuit including a third active inductor including an N-channel transistor and configured to generate a fifth mirror current based on the third mirror current; and a fourth current mirror circuit including a fourth active inductor including an N-channel transistor and configured to generate a sixth mirror current based on the second mirror current.

12. The memory device of claim 11, wherein the first current mirror circuit is configured to output the first mirror current via a first output terminal of the clock buffer, and output the second mirror current as a reference current via a first node of the fourth active inductor of the fourth current mirror circuit, wherein the first current mirror circuit and the fourth current mirror circuit are connected to each other through the first node, wherein the second current mirror circuit is configured to output the third mirror current as the reference current via a second node of the third active inductor of the third current mirror circuit, wherein the second current mirror circuit and the third current mirror circuit are connected to each other through the second node, and wherein the fourth current mirror circuit is configured to output the fourth mirror current via a second output terminal of the clock buffer.

13. The memory device of claim 12, wherein the clock buffer is configured to output an output signal via the first output terminal based on a difference between the first mirror current and the fifth mirror current.

14. The memory device of claim 13, wherein the clock buffer is configured to output an inverted output signal via the second output terminal based on a difference between the fourth mirror current and the sixth mirror current.

15. The memory device of claim 14, wherein the first current mirror circuit further includes a first PMOS transistor and a second PMOS transistor having gate terminals connected to a drain node of the P-channel transistor of the first active inductor, wherein the first PMOS transistor is configured to output the first mirror current via the first output terminal through a drain node of the first PMOS transistor, and wherein the second PMOS transistor is configured to output the second mirror current via the first node of the fourth current mirror circuit through a drain node of the second PMOS transistor.

16. The memory device of claim 14, wherein the second current mirror circuit further includes a third PMOS transistor and a fourth PMOS transistor having gate terminals connected to a drain node of the P-channel transistor of the second active inductor, wherein the third PMOS transistor is configured to output the third mirror current via the second node of the third current mirror circuit through a drain node of the third PMOS transistor, and wherein the fourth PMOS transistor is configured to output the fourth mirror current via the second output terminal through a drain node of the fourth PMOS transistor.

17. The memory device of claim 14, wherein the third current mirror circuit further includes a first NMOS transistor having a gate terminal connected to a drain node of the N-channel transistor of the third active inductor, and wherein the first NMOS transistor is configured to output the fifth mirror current via the first output terminal through a drain node of the first NMOS transistor.

18. The memory device of claim 14, wherein the fourth current mirror circuit further includes a second NMOS transistor having a gate terminal connected to a drain node of the N-channel transistor of the fourth active inductor, and wherein the second NMOS transistor is configured to output the sixth mirror current via the second output terminal through a drain node of the second NMOS transistor.

* * * * *